US008665006B2

(12) United States Patent
Scilla et al.

(10) Patent No.: US 8,665,006 B2
(45) Date of Patent: Mar. 4, 2014

(54) ELECTRONIC TRIMMING CIRCUIT

(75) Inventors: Giuseppe Scilla, Catania (IT); Francesco DiStefano, Palagonia (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 0 days.

(21) Appl. No.: 13/468,355

(22) Filed: May 10, 2012

(65) Prior Publication Data

US 2012/0286848 A1   Nov. 15, 2012

(30) Foreign Application Priority Data

May 13, 2011   (IT) .............................. MI2011A0844

(51) Int. Cl.
*H01H 37/76*   (2006.01)
(52) U.S. Cl.
USPC .......................................................... 327/525
(58) Field of Classification Search
USPC ......................................... 327/525, 524, 526
See application file for complete search history.

(56) References Cited

U.S. PATENT DOCUMENTS

| | | | | |
|---|---|---|---|---|
| 4,673,866 A | * | 6/1987 | Masuda ......................... | 323/313 |
| 4,799,043 A | * | 1/1989 | Ueda .............................. | 307/116 |
| 5,150,216 A | * | 9/1992 | Tokitou et al. ................ | 348/299 |
| 5,408,885 A | * | 4/1995 | Araki .............................. | 73/708 |
| 5,675,280 A | * | 10/1997 | Nomura et al. ................ | 327/538 |
| 5,838,076 A | * | 11/1998 | Zarrabian et al. ............. | 307/115 |
| 6,169,393 B1 | * | 1/2001 | Hashimoto ................... | 323/354 |
| 7,254,080 B2 | * | 8/2007 | Kimura ...................... | 365/225.7 |
| 7,733,158 B2 | * | 6/2010 | Huang et al. .................. | 327/525 |
| 8,022,751 B2 | * | 9/2011 | Le et al. ........................ | 327/539 |
| 8,061,895 B2 | * | 11/2011 | Tsukude ........................ | 374/176 |
| 8,441,306 B2 | * | 5/2013 | Chen et al. .................... | 327/525 |
| 8,525,579 B2 | * | 9/2013 | Scilla et al. ................... | 327/525 |
| 2012/0206192 A1 | * | 8/2012 | Fletcher et al. ............... | 327/539 |
| 2012/0275244 A1 | * | 11/2012 | Do .......................... | 365/189.11 |
| 2012/0293241 A1 | * | 11/2012 | Scilla et al. .................. | 327/525 |

FOREIGN PATENT DOCUMENTS

| | | |
|---|---|---|
| GB | 2206730 | 1/1989 |
| JP | 62166558 | 7/1987 |
| JP | 10209282 | 8/1998 |
| JP | 2002184954 | 6/2002 |
| JP | 2004165319 | 6/2004 |
| JP | 2009212415 | 9/2009 |
| WO | 0201708 | 1/2002 |

* cited by examiner

*Primary Examiner* — Thomas J Hiltunen
(74) *Attorney, Agent, or Firm* — Allen, Dyer, Doppelt, Milbrath & Gilchrist, P.A.

(57) ABSTRACT

The trimming circuit includes a plurality of trimmable resistances that may be coupled among them, each resistance being connected in parallel to a respective fuse. The trimming circuit allows burning any number of fuses according to a fixed trimming sequence using only one or two dedicated pins because it includes an input diode-connected transistor and a plurality of trimming transistors of different sectional area, each connected to force current throughout a respective one of the shunt fuses and coupled to the input diode-connected transistor such to mirror the current flowing therethrough. The fuses of the trimming circuit may be burnt by applying a trimming voltage to the diode-connected input transistor with a voltage generator connected between a dedicated pin of the circuit and a terminal at a reference potential, such to force a current therethrough as long as the mirrored currents flowing throughout the fuses burn them.

12 Claims, 3 Drawing Sheets

ELECTRONIC TRIMMING CIRCUIT

FIELD OF THE INVENTION

The invention relates to the field of electronic trimming of integrated circuits and more particularly to a circuit for carrying out a trimming operation on circuit portions of integrated circuits, having at most two dedicated pins for the trimming operation.

BACKGROUND OF THE INVENTION

When a high accuracy level is required, dedicated trim circuitry must be provided in the integrated circuit for allowing modification of certain electrical parameters at the integrated circuit testing stage. This operation is commonly referred to as trimming.

These parameter modifications are usually performed at a wafer testing stage. Integrated circuits are fabricated on wafers of semiconductor material, and an electrical wafer sort (EWS) test is conducted on the wafer prior to severing the individual integrated circuit die destined to final packaging operations.

Trimming may even need to be carried out at the packaged circuit device final testing stage. Indeed, the isolating resin injected into the mold exerts a pressure on the semiconductor chip that may cause mechanical stress/strain on the crystalline semiconductor capable of altering electrical parameters. For this reason, it may be necessary to carry out a trimming operation when the packaged circuit device is tested.

An example of a functional circuit device that requires a trimming at a very late stage of the fabrication process is a band-gap regulator for producing a constant voltage reference insensitive to the working temperature. Regulators of this type are present in numerous system-on-chip devices, as those present in cellular telephones, data communication devices and most battery powered portable sets.

At least two low-drop linear regulators are generally provided in such apparatuses made to comply with stringent specifications, especially in connection with their operating accuracy when temperature, supply voltage, and other parameters vary. It is for these stringent reasons of ensuring accuracy of operation under varying conditions that a trimming operation should be carried out on the regulator circuit after completion of the packaging of the integrated circuit device that incorporates it.

A conventional technique, rarely implemented, includes using strips of appropriate material (commonly Cr—Si) connected between two pins of the integrated circuit device and in forcing a current through the strip to permanently modify the resistance of the strip and fix in this way the output voltage to be compensated.

According to another technique, a band-gap voltage generator is equipped with a logic circuit or a memory programmed by fuses or ZAP Zener diodes, that act/configure circuit elements (for example, MOS transistors) of the band-gap generator such to fix the generated reference voltage. This trimming technique has the advantage of being implementable with a reduced number of pins, but requires a relatively complex logic circuitry that occupies a relevant silicon area.

A conventional trimming circuit is schematically shown in FIG. 1. The trimming circuit 1 is rather simple; it is substantially a dipole comprising a first resistor R1 connected between a terminal A and a terminal B. A series of a second resistor R2 and of a ZAP Zener diode is connected in parallel to the first resistor R1.

ZAP Zener diodes behave as an open circuit until the voltage across them exceeds a predetermined threshold value, typically 7V for a component fabricated by a third-generation BCD process. When this threshold is exceeded and a relatively large current (for example 250 mA) is being forced through the diode, the ZAP Zener diode changes its electrical characteristic permanently and becomes a resistive component of few Ohms (short-circuit).

FIG. 2 shows substantially the same structure as in FIG. 1, but a fuse FUSE is provided in place of the ZAP Zener diode. The operation of the trimming circuit shown in FIG. 2 is similar to that of the circuit in FIG. 1. In this case, the fuse would only be opened (burnt) by a current larger than a predetermined value.

The approach shown in FIG. 1 is the one that is generally adopted for BCD processes, because it provides more reliable performance over time and allows the outcome of the trimming operation to be monitored by externally short-circuiting the terminals C and D before carrying out the trimming. Although quite popular, the conventional approaches of FIGS. 1 and 2 require N+1 dedicated pins for trimming N ZAP Zener diodes or fuses.

A trimming circuit adapted to be used with any kind of circuit device to be trimmed after packaging, offering the same advantages of classic trimming circuits of FIGS. 1 and 2 though requiring a reduced number of dedicated pins for carrying out the trimming step, is highly desirable.

SUMMARY OF THE INVENTION

A trimming circuit, in accordance with features of the present invention, has a reduced number of components and may require only two additional pins independently from the number of fuses of the circuit.

Similar to conventional trimming circuits, the present trimming circuit comprises a plurality of trimmable resistances that may be coupled among them, each resistance being connected in parallel to a respective fuse. Different from prior art trimming circuits, the present trimming circuit allows burning any number of fuses according to a fixed trimming sequence using only one or at most two dedicated pins because it comprises an input diode-connected transistor and a plurality of trimming transistors of different sectional area, each connected to force current throughout a respective one of the shunt fuses and coupled to the input diode-connected transistor such to mirror the current flowing therethrough.

The fuses of the present trimming circuit may be burnt by applying a trimming voltage to the diode-connected input transistor with a voltage generator connected between a dedicated pin of the circuit and a terminal at a reference potential, such to force a current therethrough as long as the mirrored currents flowing throughout the fuses burn them.

As an alternative, a trimming current is forced throughout the diode-connected input transistor with a current generator connected to two dedicated pins of the circuit.

A method of trimming portions of an integrated circuit device using the present trimming circuit is also provided.

DETAILED DESCRIPTION OF THE PREFERRED EMBODIMENTS

An exemplary embodiment of the proposed electronic trimming circuit will be described with reference to FIG. 3. The trimming circuit may be incorporated into any integrated circuit device having portions that require trimming. For example, the trimming circuit could be used in combination with a conventional generator of a bandgap voltage.

Figure 1:
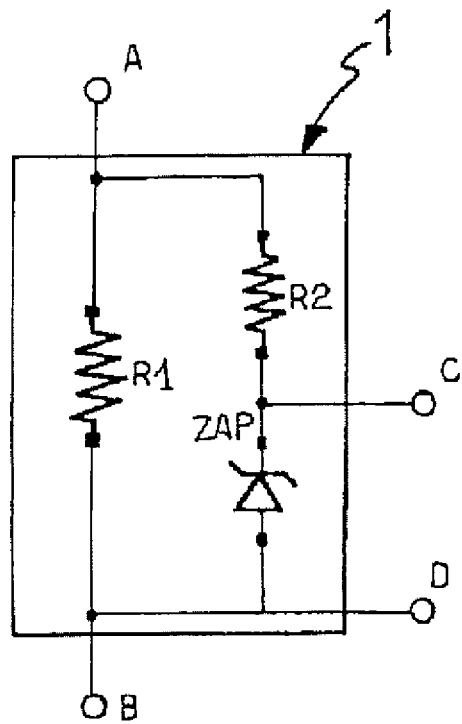
FIG. 1 is a schematic diagram illustrating a conventional trimming circuit including a ZAP Zener diode in accordance with the prior art.
Figure 2:
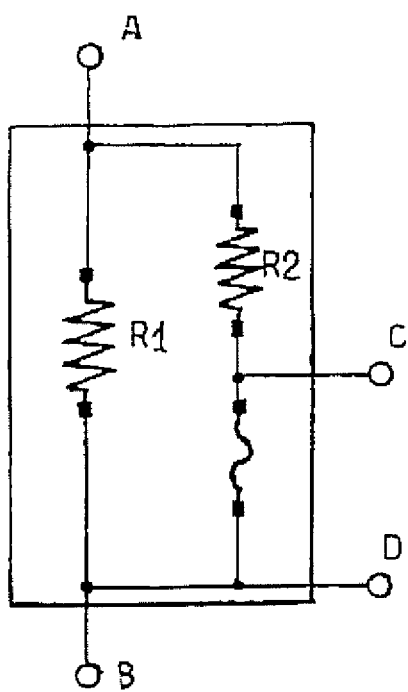
FIG. 2 is a schematic diagram illustrating another conventional trimming circuit including a fuse in accordance with the prior art.
Figure 3:
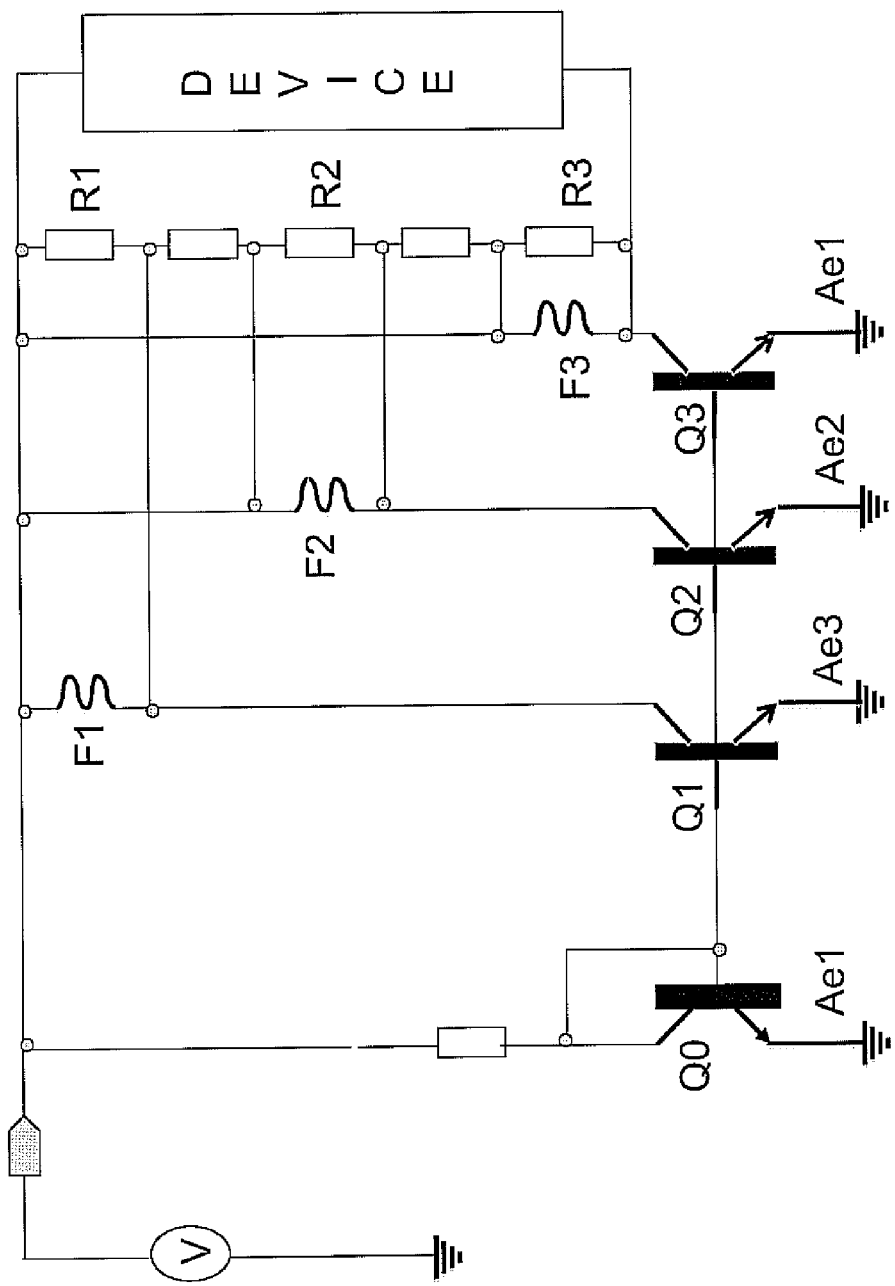
FIG. 3 is a schematic diagram illustrating a trimming circuit according to an embodiment of the present invention with a single dedicated trimming pin.

The trimming circuit of FIG. 3 has a number N of fuses Fi each connected in parallel to a trimming resistance Ri. Typically, the trimming resistances Ri are portions of the body resistance of the integrated circuit device to be trimmed and are shorted unless the respective fuses are burnt.

The trimming circuit has a plurality of N trimming transistors Qi all connected to a same input transistor Q0 such to form N current mirrors that generate N respective replica currents according to respective mirror ratios. The trimming transistors Qi in general have different sectional areas and are connected as shown in FIG. 3 such to force substantially the whole mirrored replica current throughout the respective fuses Fi. Therefore, when an input trimming current flows throughout the input transistor Q0, the respective fuses Fi are in general crossed by different currents.

The fuses are preferably identical among them and thus they burn when crossed by a same current. As a consequence, the fuse connected to the trimming transistor with the largest sectional area will burn first, then the fuse connected to the second largest trimming transistor will burn, and so on.

Therefore, it is possible to determine the number of fuses to be burnt simply by fixing the trimming voltage V applied on the dedicated input pin, that determines the current forced through the input transistor Q0 and thus the current in all trimming transistors Qi. The trimming sequence of fuses is fixed by determining the sectional area of the trimming transistors Qi in a fabrication phase of the circuit. To have a trimming sequence and not to burn all the fuses at the same time, it may be necessary to have transistors with a sectional area chosen at least between two possible values.

Figure 4:
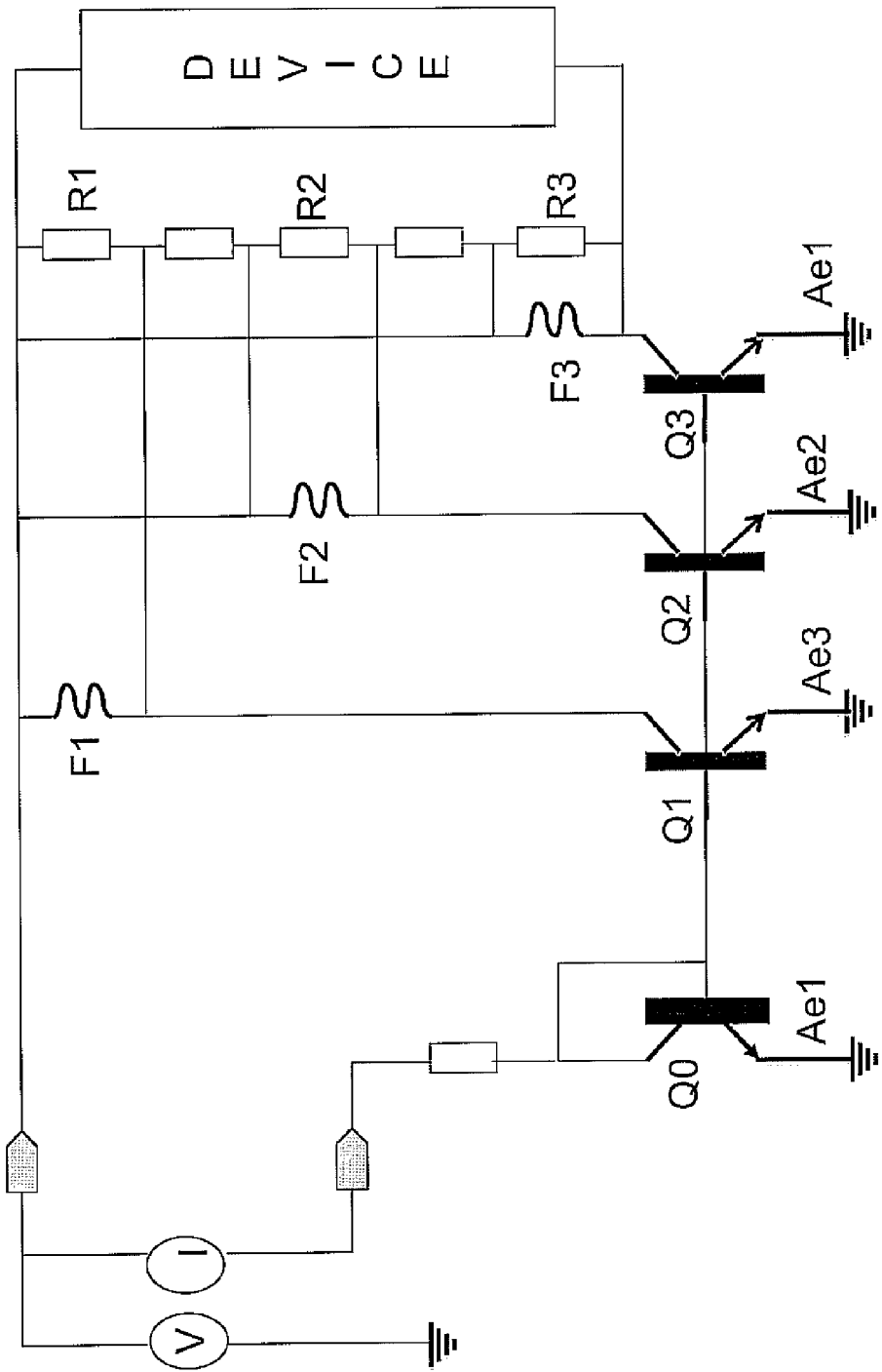
FIG. 4 is a schematic diagram illustrating a trimming circuit according to another embodiment of the present invention with two dedicated trimming pins.

According to an alternative embodiment with two dedicated input pins, depicted in FIG. 4, the current throughout the input transistor Q0 is forced by a trimming current generator I. The difference between the current forced throughout the input transistor and the current flowing throughout the trimming transistors flows through the input voltage generator V.

The herein proposed trimming circuits are particularly advantageous because they may be fabricated without implementing additional process steps and only one or at most two dedicated pins are needed for all trimming steps independently from the number of fuses to be trimmed.

The present trimming circuits allow to trim any circuit device, even after the packaging stage, with a great accuracy and with results that are stable during the functioning life of the circuit device. Moreover they use low-cost components and do not need any dedicated logic circuitry as in similar prior circuits, that cause a relevant silicon area consumption.

The present trimming circuits may be realized in any MOS or BJT technology.

That which is claimed is:

1. An electronic trimming circuit configured to carry out a trimming operation on portions of an integrated circuit device, comprising:
a plurality of trimmable resistances coupled together;
a plurality of shunt fuses, each trimmable resistance being coupled in parallel to a respective shunt fuse;
an input diode-connected transistor; and
a plurality of trimming transistors coupled to said input diode-connected transistor to generate respective mirrored replica currents of a current to pass through said input diode-connected transistor, each trimming transistor being coupled to a respective one of said shunt fuses to send the respective mirrored replica current therethrough.

2. The electronic trimming circuit of claim 1, wherein a sectional area of a respective trimming transistor is different from the sectional area of the other trimming transistors.

3. The electronic trimming circuit of claim 1, further comprising first and second inputs; wherein said input diode-connected transistor is coupled between the first input and a reference voltage; and wherein respective shunt fuses are coupled between the second input and respective trimming transistors.

4. An electronic trimming circuit comprising:
a plurality of resistances coupled together;
a plurality of shunt fuses;
each resistance being coupled in parallel to a respective shunt fuse;
an input transistor; and
a plurality of trimming transistors coupled together and to said input transistor, each trimming transistor being coupled to a respective one of said shunt fuses.

5. The electronic trimming circuit of claim 4, wherein said input transistor comprises an input diode-connected transistor.

6. The electronic trimming circuit of claim 4, wherein a sectional area of a respective trimming transistor is different from the sectional area of the other trimming transistors.

7. The electronic trimming circuit of claim 4, further comprising first and second inputs; wherein said input transistor is coupled between the first input and a reference voltage; and wherein respective shunt fuses are coupled between the second input and respective trimming transistors.

8. A method of trimming portions of an integrated circuit device with a trimming circuit including a plurality of trimmable resistances coupled together, a plurality of shunt fuses, each trimmable resistance being coupled in parallel to a respective shunt fuse, an input diode-connected transistor, and a plurality of trimming transistors coupled to the input diode-connected transistor to generate respective mirrored replica currents of a current to pass through the input diode-connected transistor, each trimming transistor being coupled to a respective one of the shunt fuses to send the respective mirrored replica current therethrough, the method comprising:
providing the trimming transistors with respective sectional areas that are determined based upon a trimming sequence and corresponding mirror current ratios for the shunt fuses;
providing an input current throughout the input diode-connected transistor.

9. The method of claim 8, wherein a sectional area of a respective trimming transistor is different from the sectional area of the other trimming transistors.

10. A method of trimming portions of an integrated circuit device comprising:
providing a trimming circuit by coupling a plurality of trimmable resistances together, coupling a respective shunt fuse in parallel to each trimmable resistance, coupling an input transistor to a plurality of trimming transistors, and coupling each trimming transistor to a respective one of the shunt fuses;

providing the trimming transistors with respective sectional areas that are determined based upon a trimming sequence and corresponding mirror current ratios for the shunt fuses;

providing an input current throughout the input diode-connected transistor.

11. The electronic trimming circuit of claim 10, wherein the input transistor comprises an input diode-connected transistor.

12. The method of claim 10, wherein a sectional area of a respective trimming transistor is different from the sectional area of the other trimming transistors.

* * * * *